US008356273B2

(12) United States Patent
Pons et al.

(10) Patent No.: US 8,356,273 B2
(45) Date of Patent: Jan. 15, 2013

(54) METHOD AND DEVICES TO ASSIST IN DETERMINING THE FEASIBILITY OF AN ELECTRONIC ASSEMBLY

(75) Inventors: Philippe Pons, Muret (FR); Regis Pelouse, Toulouse (FR)

(73) Assignee: Airbus Operations SAS, Toulouse (FR)

( * ) Notice: Subject to any disclaimer, the term of this patent is extended or adjusted under 35 U.S.C. 154(b) by 552 days.

(21) Appl. No.: 12/375,686

(22) PCT Filed: Jul. 26, 2007

(86) PCT No.: PCT/FR2007/001289
§ 371 (c)(1),
(2), (4) Date: Jan. 30, 2009

(87) PCT Pub. No.: WO2008/015328
PCT Pub. Date: Feb. 7, 2008

(65) Prior Publication Data
US 2009/0193371 A1    Jul. 30, 2009

(30) Foreign Application Priority Data

Aug. 2, 2006    (FR) ..................................... 06 53255

(51) Int. Cl.
*G06F 17/50*    (2006.01)
(52) U.S. Cl. ......... 716/137; 716/118; 716/119; 716/127
(58) Field of Classification Search .................. 716/100, 716/137, 118–119, 122; 79/739
See application file for complete search history.

(56) References Cited

U.S. PATENT DOCUMENTS

| 5,539,652 | A |   | 7/1996 | Tegethoff |  |
|---|---|---|---|---|---|
| 5,691,913 | A | * | 11/1997 | Tsuchida et al. | 716/122 |
| 5,745,371 | A | * | 4/1998 | Shouen | 716/102 |
| 6,353,915 | B1 |   | 3/2002 | Deal et al. |  |
| 6,496,957 | B1 | * | 12/2002 | Kumagai | 716/112 |
| 6,678,877 | B1 | * | 1/2004 | Perry et al. | 361/720 |
| 6,898,580 | B1 |   | 5/2005 | Curran et al. |  |
| 7,216,327 | B2 | * | 5/2007 | Yaguchi et al. | 716/130 |
| 7,257,792 | B2 | * | 8/2007 | Nakayama et al. | 716/122 |
| 7,448,016 | B2 | * | 11/2008 | Tai et al. | 716/137 |
| 7,877,720 | B2 | * | 1/2011 | Staiger et al. | 716/137 |
| 2003/0014287 | A1 | * | 1/2003 | Williams et al. | 705/7 |
| 2005/0080502 | A1 |   | 4/2005 | Chernyak et al. |  |

FOREIGN PATENT DOCUMENTS

EP        0 942 382        9/1999

* cited by examiner

*Primary Examiner* — Nghia Doan
(74) *Attorney, Agent, or Firm* — Oblon, Spivak, McClelland, Maier & Neustadt, L.L.P.

(57) ABSTRACT

The invention concerns a method and devices for analyzing the feasibility of a computer system composed of subsystems, each having functions. After having determined the functional architecture of the computer system comprising at least one subsystem and at least one function, the characteristics of the functions implemented are imported from a database. The user determines the number of subsystems and the number of connectors per subsystem. He then distributes the functions to the subsystems and enters the characteristics of the connectors and the characteristics of the subsystems. The computer system is analyzed in light of the information provided by the user and the characteristics of the functions implemented in order to determine the feasibility of the computer system.

15 Claims, 5 Drawing Sheets

Fig. 3

| Type | Number | Functions Designation | Reference | Space requirement | | | | Electrical charac. | | | Miscellaneous | | | | SE 1 | | SE 2 | | SE 3 | |
|---|---|---|---|---|---|---|---|---|---|---|---|---|---|---|---|---|---|---|---|---|
| | | | | Area comp. face | Area solder face | Height comp. face | Height solder face | Supply voltage | Consumption | Power consumed | No. connections | Reliability | Cost | Remarks | No. functions | No. connections | No. functions | No. connections | No. functions | No. connections |
| | | Number of subassemblies | 3 | | | | | | | | | | | | | | | | | |
| | | Number of connectors of SE 1 | 1 | | | | | | | | | | | | | | | | | |
| | | Number of connectors of SE 2 | 1 | | | | | | | | | | | | | | | | | |
| | | Number of connectors of SE 3 | 1 | | | | | | | | | | | | | | | | | |
| RF | 6 | TRANS/GEST_CAN (CAN) | 0 | 450 | 0 | 4 | 0 | 5 | 0,93 | 4,65 | 2 | 1,00E-09 | 40 | | 2 | 2 | 2 | 2 | 2 | 2 |
| RF | 2 | PBGA456 (FPGA) | 0 | 1478 | 0 | 10 | 0 | 3,3 | 1 | 3,3 | 0 | 1,00E-09 | 1 | | 1 | 4 | 1 | 4 | 1 | 4 |
| RF | 4 | RS232 (RS232) | 0 | 82 | 39 | 2 | 0,5 | 3,3 | 10 | 33 | 2 | 1,00E-09 | 10 | | 2 | 0 | 2 | 4 | 0 | 0 |
| RF | 4 | PPC 775 (number memories) | 0 | 441 | 0 | 3 | 0 | 3,3 | 2000 | 6600 | 0 | 1,00E-09 | 1 | | 0 | 4 | 1 | 0 | 3 | 0 |
| RF | 1 | flash memory (number memories) | 0 | 11841 | 568 | 12 | 2 | 3,3 | 3920 | 12936 | 0 | 1,05E-08 | 11 | | 0 | 0 | 1 | 0 | 0 | 0 |

Fig. 4

METHOD AND DEVICES TO ASSIST IN DETERMINING THE FEASIBILITY OF AN ELECTRONIC ASSEMBLY

The present invention relates to the design of electronic assemblies and more particularly to a method and devices for aiding in determining the feasibility of an electronic assembly.

Figure 1:
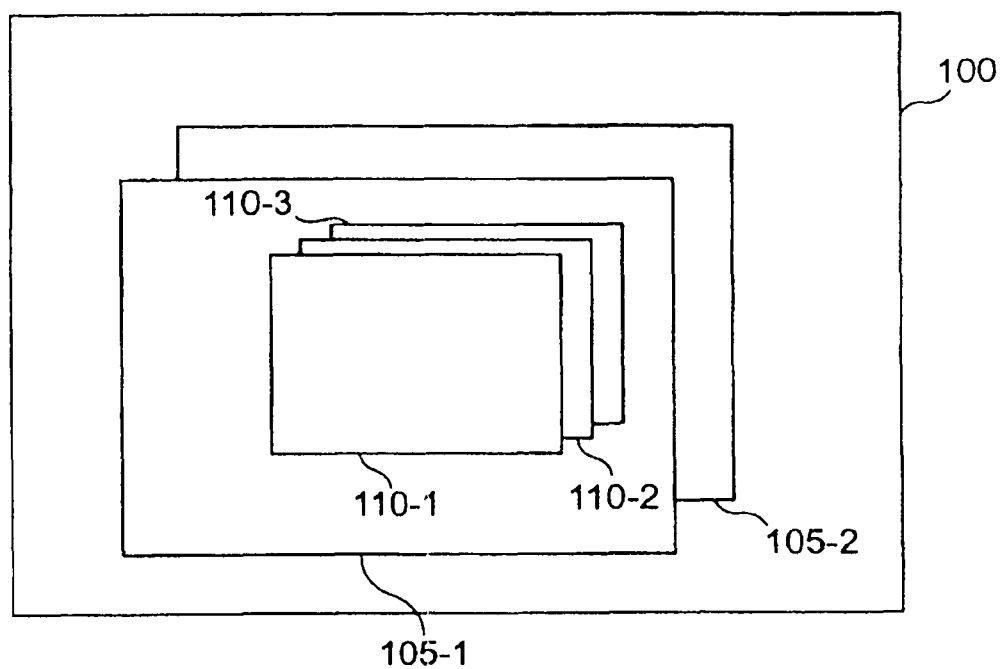

The study of feasibility of an electronic assembly within the meaning of the present invention consists in determining whether it is possible to solve a complex equation taking into account a large number of criteria such as the physical dimensions, the electrical parameters, the manufacturing times or even the cost. The design of electronic assemblies such as collections of a plurality of electronic cards generally depends on the experience of the designers based on preceding developments and on an experimental analysis. FIG. 1 illustrates an example of an electronic system 100 comprising two subassemblies 105-1 and 105-2, each subassembly comprising one or more functions. As illustrated in this example, subassembly 105-1 comprises three functions 110-1, 110-2 and 110-3. Electronic system 100 can be, for example, a flight control calculator comprising a plurality of electronic cards, corresponding to the subassemblies, each electronic card having electronic modules such as calculating units (Central Processing Unit or CPU) and memory modules (Random Access Memory or RAM) for executing functions.

At present, the designers of electronic assemblies are not in possession of tools that aid them in estimating the "feasibility" of an electronic assembly and of subassemblies that may make up such an assembly. Therefore, because the capitalization of experience has not been formalized, neither the reactivity to an initial feasibility analysis and to its iterations nor the reliability of the results satisfy the expectations and needs of current development programs.

To optimize the development cycles, for example in the design of flight control calculators composed of a plurality of electronic cards, each having numerous electronic functions, it is necessary to respond in reactive and reliable manner in the preliminary project or preliminary design phases of an electronic assembly. It is therefore desirable to take into account the experience capitalized in a hierarchical design and reutilization concept and to use a 'simple' function to enter the development process and the information system for electronic development and its databases.

A need therefore exists for rapidly and reliably estimating the "physical" feasibility (simple virtual prototype) of an electronic assembly composed of electronic subassemblies by using the experience of preceding programs and prospective studies.

The invention makes it possible to solve at least one of the problems mentioned hereinabove.

The object of the invention is therefore a computer method for analyzing the feasibility of an electronic assembly composed of at least one subassembly, this method being characterized in that it comprises the following steps:

- defining a functional architecture of the electronic assembly that comprises a list of functions, the list of functions comprising at least one function;
- acquiring the characteristics of the functions;
- determining the number of subassemblies;
- distributing the functions of the list of functions over the subassemblies;
- determining the characteristics of the subassemblies; and
- analyzing the electronic assembly.

The method according to the invention is therefore aimed at improving the process of development of an electronic assembly by a rapid and precise analysis of the distribution of functions at the level of each of the subassemblies. The analysis is performed on a set of significant parameters described in libraries of reusable components and functions.

The method according to the invention makes it possible to use the acquired experience for rapid analysis of the "physical" predictive feasibility of a new electronic need. It also permits integration of the feasibility study into the methodological process and into the information system for electronic development. It makes it possible to add complementary functionalities and to take into account the evolution of parameters of the functions by using program experience making it possible to refine the indicators of the analysis and to capitalize the experience.

According to a particular embodiment, the characteristics of the functions are stored in memory in a database in order to benefit from the acquired experience.

According to another particular embodiment, the method additionally comprises a step of determining if, starting from the analysis of the electronic assembly, the electronic assembly is feasible as regards presenting concise information to the user. This result of the analysis also may be used in the development phase to validate the electronic assembly without systematic intervention of the user, especially following a change of parameter.

According to another particular embodiment, the method comprises a step of modifying the functional architecture, the number of subassemblies, the distribution of the functions over the subassemblies or the characteristics of the subassemblies, the step of analysis of the electronic assembly being repeated after the modification. According to this embodiment, the user may adapt the parameters of the electronic assembly in order to analyze the behavior of the feasibility of this electronic assembly without having to re-acquire all of the elements.

According to another particular embodiment, the method according to the invention comprises a step of determining the number of connectors per subassembly and a step of choosing the characteristics of the connectors. The method according to the invention additionally may comprise a step of modifying the number of connectors per subassembly or the characteristics of the connectors, the step of analysis of the electronic assembly being repeated after the modification.

In a particular embodiment, the characteristics of the functions, connectors and subassemblies comprise physical or electrical characteristics or characteristics related to the production times and costs.

According to another particular embodiment, the step of analysis of the electronic assembly comprises a step of evaluation of constraints related to the characteristics of the functions, connectors and subassemblies.

According to a particular embodiment, the step of analysis of the electronic assembly comprises a step of comparison of the evaluated constraints with data entered by a user.

According to another particular embodiment, the step of comparison of the evaluated constraints with the data entered by a user comprises the application of predetermined rules in order to permit the method to adapt and evolve according to particular and future needs.

In a particular embodiment, the user interface is of the spreadsheet type. According to another particular embodiment, a first spreadsheet is associated with the functional architecture of the electronic assembly and a second spreadsheet is associated with each subassembly. The use of spreadsheets permits simple, rapid, clear and effective implementation of the method according to the invention.

According to another particular embodiment, the functions may be composed of elementary functions. The use of functions based on other functions permits rapid implementation of the method according to the invention and makes it easy to update the parameters of the functions.

Another object of the invention is a device for analyzing the feasibility of an electronic assembly composed of at least one subassembly having at least one function, the device comprising means adapted to the implementation of each of the steps of the method described hereinabove.

Another object of the invention is a computer program for analyzing the feasibility of an electronic assembly composed of at least one subassembly having at least one function, the computer program comprising means adapted to the implementation of each of the steps of the method described hereinabove.

Figure 2:
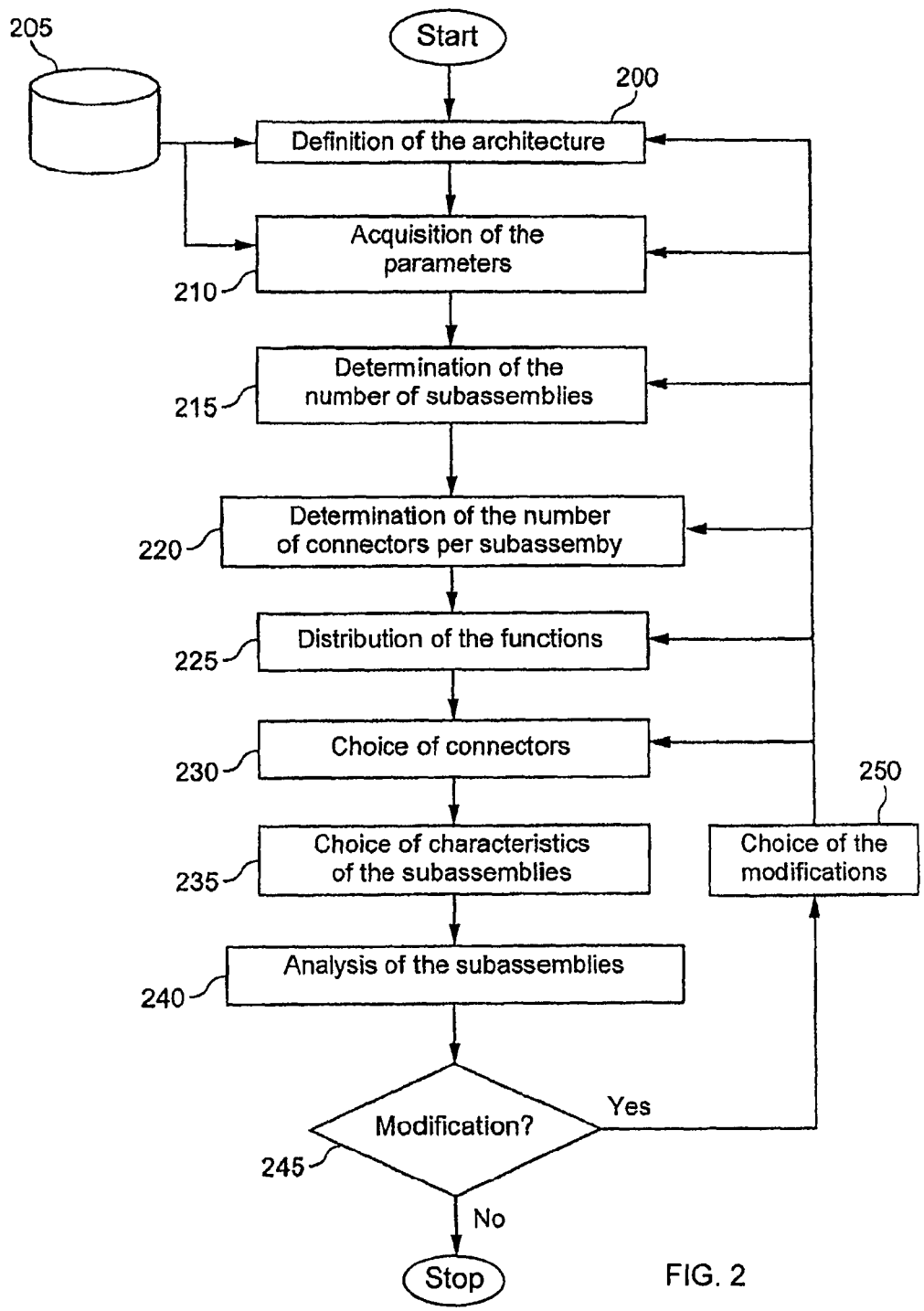
Figure 5:
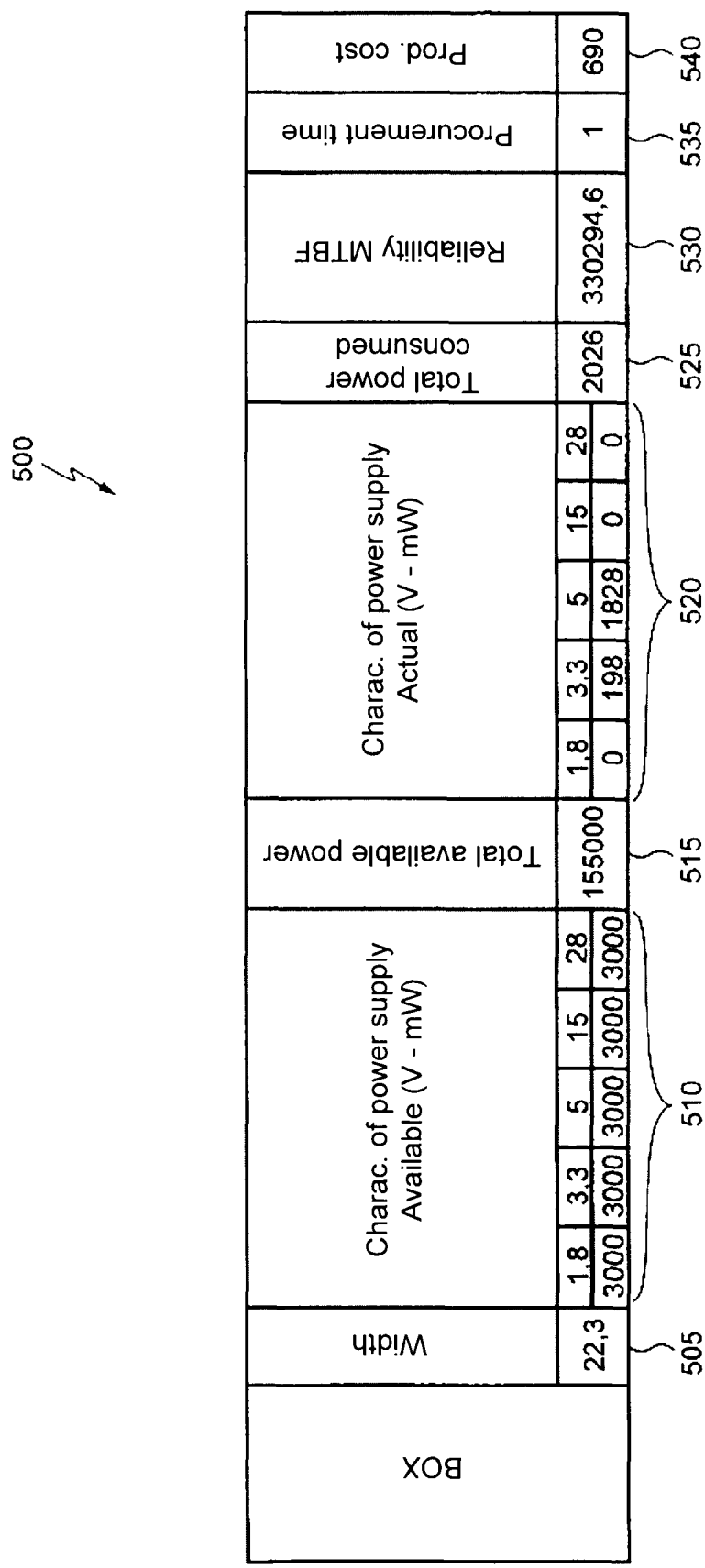

Other advantages, objectives and characteristics of the present invention will become evident from the detailed description provided hereinafter by way of non-limitative example with reference to the attached drawings, wherein:

FIG. 1 schematically represents the constitution of an electronic assembly;

FIG. 2 illustrates certain steps of the method for aiding in determining the feasibility of an electronic assembly according to the invention;

FIG. 3 presents an example of a catalog associated with a particular functional architecture of an electronic assembly;

Figure 4:
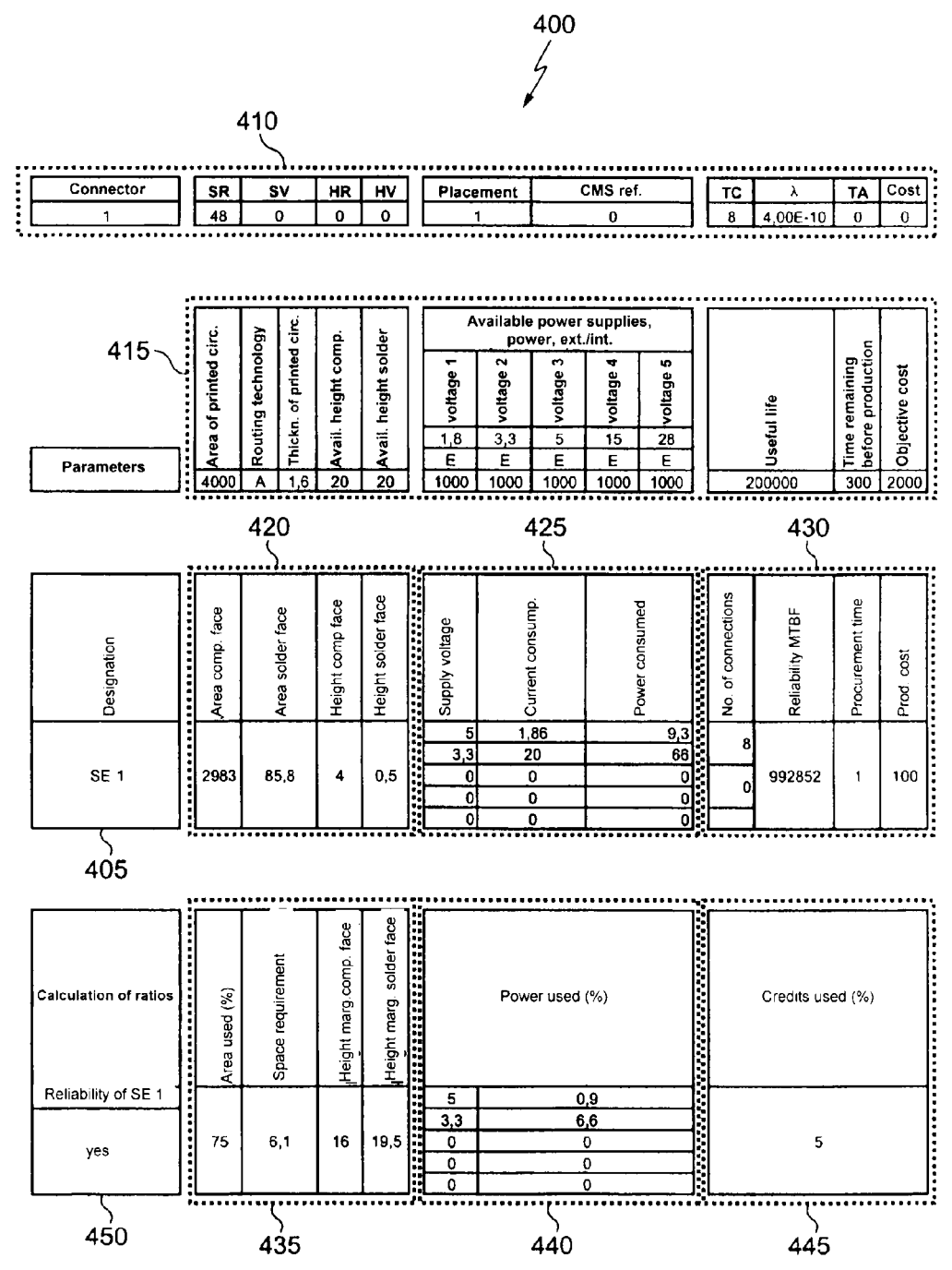

FIG. 4 shows an example of a descriptive sheet associated with a subassembly of the electronic assembly as well as the results produced by the analysis pertaining to this subassembly; and FIG. 5 illustrates an overview of the electronic assembly.

The method according to the invention for analyzing the feasibility of an electronic assembly may be exploited independently to permit, in the preliminary project phase, for example, a rapid estimate of the feasibility of an electronic assembly. By extension, the method according to the invention may be integrated into the cycle of preliminary design of the assembly or of an electronic subassembly in the electronic design laboratory. This method, situated downstream from the phase of definition of functional architecture of the equipment, makes it possible to identify the hardware requirements of the specification.

The method according to the invention analyzes an architecture defined by the user according to a predetermined set of parameters in order to indicate whether or not this architecture is feasible. The result of the analysis may be used as indicator in the development cycle. This result comprises an indication of success or failure and also may comprise indications associated with the analysis of each parameter. If the result of the analysis shows that the architecture is unworkable, the method makes it possible to modify the defined architecture and to repeat the feasibility analysis. If the architecture is workable, the analysis report may be used to undertake new tests, such as validation of the functional dependability (SDF) of the adopted architecture.

The method of analysis of feasibility therefore becomes an aid in designing an electronic assembly and/or subassembly or subassemblies. It makes it possible to estimate and validate a physical distribution of the functions at the level of the subassemblies on the basis of a functional architecture of the electronic assembly as a function of constraints imposed by the user and of information obtained from data libraries.

Estimation and validation are achieved by the analysis of parameters extracted from these libraries or databases by taking into account the constraints imposed by the user. The validation is based on a predetermined set of parameters and thus reflects a set of requirements.

The parameters used for the analysis are, for example, the following parameters:
number of connections;
areas;
heights;
power consumed for each applied voltage;
reliability (Mean Time Between Failures or MTBF);
procurement time; and
cost of the components.

FIG. 2 describes certain steps of the method for aiding in determining the feasibility of an electronic assembly. According to a first step 200, the user functionally defines the architecture of the electronic assembly for which the feasibility is to be analyzed. For that purpose, the user determines all of the functions constituting the electronic assembly. Several types of functions may be used, such as, for example, elementary functions (FE) and functions of functions (FF), the functions of functions being composed of a plurality of elementary functions. All functions (FE and FF) are stored in memory in one or more databases 205. When a function of functions is entered into database 205, its parameters are evaluated according to the parameters associated with the elementary functions that it uses. When a parameter of an elementary function is modified, the parameters of the functions of functions using this elementary function are preferably re-evaluated automatically. In the description hereinafter, the term "function" designates elementary functions and functions of functions, without distinguishing between them. A function may correspond, for example, to an operation executed by one or more electronic components or to an operation executed by part of an electronic component. The functional architecture is stored in memory in a catalog having the form of a list of functions. If the architecture is provided with a plurality of functions of identical type, the list comprises the number of these functions. Preferably one catalog is created for each architecture.

A subsequent step consists in acquiring the parameters of the functions of the defined architecture (step 210), these parameters associated with each function being stored in memory in database 205. The parameters associated with the functions may comprise their area, their height, the power consumed, their reliability, the procurement time and their cost. In a preferred embodiment, the number of connections of each function to another function or to a connector of a subassembly is also part of the parameters. The parameters of the functions are automatically imported from the database to the catalog created in the preceding step.

In a subsequent step, the user indicates the number of subassemblies of the electronic assembly to be analyzed (step 215). A subassembly is defined as being a physical part of the analyzed electronic assembly. The choice of the number of subassemblies may be imposed by physical constraints or by other constraints known to the user. In a preferred embodiment, each subassembly is referenced by a unique reference, such as a number. The references to the subassemblies are added to the previously created catalog. A recapitulation sheet is preferably created for each subassembly.

After having defined the number of subassemblies, the user preferably indicates the number of connectors of each subassembly (step 220). A connector is a connecting module for electrically connecting two subassemblies or for electrically connecting a subassembly to the environment in which it is placed, such as a basket bottom or backplane. Alternatively, a backplane may be considered as a subassembly provided with connectors to other subassemblies and possibly a connector to the exterior. A connection without wires or wireless connection also is considered to be a connector. Each subassembly may have as many connectors as necessary to communicate with other subassemblies or with the exterior. The references to the connectors are added to the catalog and associated with the corresponding subassemblies, as well as in the corresponding recapitulation sheets of the subassemblies.

The user distributes the functions over the subassemblies (step 225). All the functions of the created catalog are distributed over the subassemblies defined in the foregoing. For each function of the catalog, the user indicates the reference of the subassembly to which it is allocated. Preferably, for each connection of each function of the catalog, the user also indicates the connector or the function to which the connection must be linked. The references of functions, stored in memory in the catalog, are associated with each subassembly, as well as in the corresponding recapitulation sheets of the subassemblies.

In a following step, the user defines the physical characteristics of each connector of each subassembly (step 230). The physical characteristics of a connector may be, for example, the number of connections, the space requirement and the type of fixation of the connector (rear face or front face of the subassembly). The physical characteristics of each connector are preferably stored in memory in the corresponding recapitulation sheets of the subassemblies with which they are associated.

The user also defines the characteristics of the subassemblies, especially the physical and electrical characteristics (step 235). By way of example, the physical and electrical characteristics of a subassembly may comprise its area, the routing technology used, the voltage available in the subassembly, the cost or even its reliability. In a particular embodiment, certain suggestions may be made to the user, depending on the functions and the connectors associated with the subassemblies. For example, a minimum area may be proposed according to the area of each function and of each connector, weighted with a coefficient associated with the routing. The physical and electrical characteristics of each subassembly are preferably stored in memory in the corresponding recapitulation sheets of the subassemblies.

Starting from information determined by the user and from information obtained from database 205, the system analyzes the feasibility of the electronic assembly (step 240). The analysis of feasibility of the electronic assembly is carried out for each criterion, the electronic assembly being workable if all the criteria are met. Each criterion is associated with one or more predefined parameters. During the analysis phase, each criterion is evaluated for each subassembly. If all the criteria of all the subassemblies are met, the electronic assembly is feasible. Reciprocally, if at least one criterion of at least one subassembly is not met, the electronic assembly is not feasible. An analysis report is preferably created. The analysis report indicates whether or not all the criteria are met and, if certain criteria are not met, which are the criteria not met and which are the subassemblies for which certain criteria are not met. The analysis report additionally may be provided with summary indications pertaining to the value of the parameters of the electronic assembly and of its subassemblies, as well as with margins relative to the values initially described by the user. For example, the summary report may indicate the power of the electronic assembly, its size and its cost.

Depending on the results of the analysis and the needs of the user, the latter may modify the electronic assembly (step 245). The user decides what he wishes to modify (step 250) and implements the corresponding modifications. He may modify, for example, the functional architecture of the electronic system, the number of subassemblies, the number of connectors, the distribution of functions in the subassemblies, the choice of connectors and the physical characteristics of the subsystems. When modifications are made, the process described in the foregoing resumes in the corresponding step. For example, if the user modifies the physical characteristics of the connectors (step 230), the system asks him to confirm the physical characteristics of the subassemblies or to enter new values (step 235), then the system analyzes the electronic assembly (step 240). The user then may modify the electronic assembly once again (steps 245 and 250).

FIG. 3 illustrates an example of a catalog associated with a particular functional architecture. As presented, catalog 300 can be divided into several parts. A first part 305 comprises the column headings. A second part 310 stores in memory the number of subassemblies and the number of connectors per subassembly. A third part 315 contains the list of functions used as well as their number, their characteristics and their distribution over the different subassemblies.

As indicated in second part 310, the architecture according to the presented example comprises three subassemblies, each subassembly (SE) having a single connector.

Each line of third part 315 corresponds to a particular function. In the example illustrated in FIG. 3, the columns are grouped by categories. For example, the first four columns contain information pertaining to the functions. In particular, the first column contains the type of function, the second column contains the number of each of the functions used in the architecture, the third column contains the designation of each function and the fourth column contains the reference of each function.

In the same way, a second group of columns contains information pertaining to the space requirement of the functions, a third group of columns contains information pertaining to the electrical characteristics of the functions and a fourth group of columns contains diverse information such as the number of connections or the reliability.

The last three groups of columns contain information related to the subassemblies. For example, the last group of columns indicates the number of each of the functions for the third subassembly (SE 3) and the number of connections for each of the functions and for each of the connectors of the third subassembly. It is appropriate to recall that, in this example, a single connector is used for each subassembly.

Catalog 300 is created when the user defines a new architecture. The parameters associated with the functions are drawn from a database of functions. The catalog is expanded as the user enters data pertaining to the architecture associated with the catalog, as indicated in reference to FIG. 2.

Of course, the catalog illustrated in FIG. 3 is one example, and other forms of catalog may be used to implement the invention.

FIG. 4 shows an example of a recapitulation sheet 400 of a subassembly of electronic assembly 100. As illustrated, recapitulation sheet 400 is provided with a plurality of groups of information, certain information being entered by the user, other information being calculated automatically and inserted by the system. In this example, the fields of blocks 410 and 415 are editable, to permit the user to enter values. In particular, recapitulation sheet 400 comprises reference 405 of the subassembly (SE 1) with which the sheet is associated. It also comprises the references of the connectors of this subassembly as well as the parameters associated with these connectors (reference 410). Each line of this block of data concerns a different connector. The parameters of each connector are entered by the user. The parameters include the front area of the connector (SR), its rear area (SV), its dimensioned front height (HR) and its dimensioned rear height (HV). Data pertaining to the placement of these connectors are also indicated in sheet 400, for example, 1 indicates the component side and n indicates the solder side, and internal or supplier references may be mentioned. In this example, subassembly SE 1 comprises a single connector having an area of 48 mm² on the front side and a height of zero. This connector comprises eight connections; it has a reliability determined by default to be equal to $\lambda = 4.00 \cdot 10^{-10}$. In this example, the time remaining before production (TA) and the cost are not entered, since they are not considered to be significant parameters.

The sheet additionally comprises general characteristics 415 associated with the subassembly, entered by the user, such as the area (area of the printed circuit), the manufacturing technology and the routing, the thickness of the subassembly and the usable height on the "components" side and on the "solder side". In this example, five voltages are proposed by default. These voltages are external voltages (E), meaning delivered by the electronic assembly, or internal voltages (I), meaning delivered by the subassembly. By way of illustration, five external voltages are proposed. Also indicated are the useful life of the subassembly, the time remaining before its production and its objective manufacturing cost, or in other words the credit allocated for this subassembly.

Recapitulation sheet 400 also indicates dimensions 420 of the subassembly. These dimensions are derived from the analysis and are determined mainly from functions of the subassembly and from its manufacturing technology. A distribution of the functions according to voltage is undertaken in order to determine the current consumption and the power consumed by the set of functions of the subassembly (block 425). For example, as indicated in the catalog presented in FIG. 3, subassembly SE 1 comprises two functions using a voltage of 3.3 V and two functions using a voltage of 5 V. Since the two functions using a voltage of 5 V consume 0.93 mA, the current consumption is 1.86 mA, as indicated. Block 430 indicates the number of connections per connector, the single connector in this case comprising eight connections, as well as the reliability, the procurement time and the cost of production of the subassembly, these parameters being estimated on the basis of the corresponding parameters of each function of the subassembly. The calculation of the parameters of blocks 420, 425 and 430 is detailed hereinafter in the description.

Blocks 435, 440 and 445 present, relative to the available resources such as defined by the user, the ratios and the margins of the resources used by the subassembly, estimated according to the functions distributed over the subassembly. In particular, block 435 indicates the percentage of area used, the space requirement, or in other words the thickness of the circuit plus the height of the highest components on the front and rear sides, and the height margins on the "components" side and "solder side", or in other words the difference between the available heights and the calculated heights. Similarly, block 440 indicates, for each available voltage, the ratio between the power used and the available power. Block 445 indicates the credit used, corresponding to the ratio between the cost determined for the subassembly and the cost allocated to this subassembly.

The feasibility of the subassembly is indicated in cell 450. If the subassembly is feasible, the indication 'yes' appears. Otherwise the indication 'no' appears. Other types of indications may be used.

Recapitulation sheets 400 present a summary of each subassembly according to the functions distributed over these subassemblies and the data pertaining to the subassemblies, entered by the user. Of course, the format and the data of the sheets associated with the subassemblies can be adapted according to the specific needs of the users.

In a preferred embodiment, the subassembly sheets using a color code (not illustrated) make it possible to visualize rapidly, in each subassembly sheet, whether or not the criteria are met. For example, the data background may be in green if a datum is validated and in red if it is not. For example, if the area of the subassembly is 1,000 mm² and the area estimated according to the functions of the subassembly and the routing technology is 1,050 mm², the background of the cell indicating the estimated surface is red-colored.

The evaluation of each characteristic of each subassembly is carried out according to the implemented information pertaining to each function and according to the data entered by the user. For example, the calculation of the necessary area of a subassembly on the components side can be determined from the following relationship:

$$SurfR = \sum_{i,j} (Nb\_F(i) \times SurfR\_F(i) + SurfR\_C(j)) \times \alpha + Surf\_ID \qquad (1)$$

where SurfR denotes the area on the front side of the subassembly, or in other words the area of the components side, Nb_F(i) corresponds to the number of functions F(i) implemented in the subassembly, SurfR_F(i) is the area of the function F(i) on the front side, SurfR_C(j) is the area of connector C(j) on the front side, $\alpha$ is an allowance coefficient related to the manufacturing technology (incidence related to the routing) of the subassembly, and Surf_ID is the area necessary for identification of the subassembly.

Similarly, the calculation of the necessary area of a subassembly on the solder side can be determined from the following relationship:

$$SurfV = \sum_{i,j} (Nb\_F(i) \times SurfV\_F(i) + SurfV\_C(j)) \times \alpha \qquad (2)$$

where SurfV denotes the area on the rear side of the subassembly, or in other words the area of the solder side, Nb_F (i) corresponds to the number of functions F(i) implemented in the subassembly, SurfV_F(i) is the area of the function F(i) on the rear side, SurfV_C(j) is the area of connector C(j) on the rear side and $\alpha$ is an allowance coefficient related to the manufacturing technology of the subassembly.

The allowance coefficient $\alpha$ is determined according to the selected technology. The following table illustrates an example of the relationship among the allowance coefficient, the technological parameters and the area of the function to be implemented.

| Routing technology | Technology A | Technology B | Technology C |
| --- | --- | --- | --- |
| Area allowance (according to the area S of the function) | $S > \frac{1}{2}$ dm$^2$: $\alpha = 20\%$<br>$\frac{1}{4}$ dm$^2 < S < \frac{1}{2}$ dm$^2$: $\alpha = 25\%$<br>$S < \frac{1}{4}$ dm$^2$: $\alpha = 30\%$ | $S > \frac{1}{2}$ dm$^2$: $\alpha = 15\%$<br>$\frac{1}{4}$ dm$^2 < S < \frac{1}{2}$ dm$^2$: $\alpha = 20\%$<br>$S < \frac{1}{4}$ dm$^2$: $\alpha = 25\%$ | $S > \frac{1}{2}$ dm$^2$: $\alpha = 13\%$<br>$\frac{1}{4}$ dm$^2 < S < \frac{1}{2}$ dm$^2$: $\alpha = 18\%$<br>$S < \frac{1}{4}$ dm$^2$: $\alpha = 22\%$ |
| Description of the technology | Class 5 (etching)<br>$\Delta$ dot/hole: 0.7 mm<br>12 layers | Class 5 (drilling + etching)<br>$\Delta$ dot/hole: 0.5 mm<br>12 layers | Class 6 micro-vias |

The height of the subassembly on the component side can be calculated according to the following relationship:

$$HautR = \max_{i,j}\left(\max_i(HautR\_F(i)), \max_j(HautR\_C(j))\right) \quad (3)$$

where HautR is the height of the subassembly on the component side, HautR_F(i) is the height of the function F(i) on the component side, and HautR_C(j) is the height of the connector C(j) on the component side.

Similarly, the height of the subassembly on the solder side can be calculated according to the following relationship:

$$HautV = \max_{i,j}\left(\max_i(HautV\_F(i)), \max_j(HautV\_C(j))\right) \quad (4)$$

where HautV is the height of the subassembly on the solder side, HautV_F(i) is the height of the function F(i) on the solder side, and HautV_C(j) is the height of the connector C(j) on the solder side.

The current consumption at each of these voltages can be calculated from the following relationship:

$$Courant(i) = \sum_j (Nb\_F(j) \times Courant\_F_i(j)) \quad (5)$$

where Courant(i) is the current consumed for voltage i, Nb_F(j) corresponds to the number of functions F(j) implemented in the subassembly, and Courant_F$_i$(j) is the current consumed by the function F(j) at voltage i.

The power consumed can be calculated from the following relationship:

$$P\_eff\_SE = \sum_i Nb\_F(i) \times P\_eff\_F(i) \quad (6)$$

where P_eff_SE is the actual power consumed by the subassembly, Nb_F(i) corresponds to the number of functions F(i) implemented in the subassembly and P_eff_F(i) is the actual power consumed by the function F(i).

The reliability or MTBF can be calculated from the following relationship:

$$MTBF\_SE = \frac{1}{\sum_i (Nb\_F(i) \times \lambda\_F(i)) + \sum_j (\lambda\_C(j)) + \lambda\_CSE} \quad (7)$$

where MTBF_SE is the reliability of the subassembly, Nb_F(i) corresponds to the number of functions F(i) implemented in the subassembly, $\lambda$_F(i) is the inverse of the reliability of the function F(i), $\lambda$_C(j) is the inverse of the reliability of the connector C(j) and $\lambda$_CSE is the inverse of the reliability of the circuit of the subassembly (MTBF=1/$\lambda$).

The procurement time 'Temps_SE' can be evaluated according to the following relationship:

$$Temps\_SE = \max\left(\max_i(Temps\_F(i)), \max_j(Temps\_C(j))\right) \quad (8)$$

where Temps_F(i) is the time for procurement of the component making it possible to implement the function F(i) and Temps_C(j) is the time for procurement of the connector C(j).

The production cost 'Coût_SE' can be calculated from the following relationship:

$$Coût\_SE = \sum_{i,j}(Nb\_F(i) \times Coût\_F(i) + Coût\_C(j)) + Coût\_ci + Coût\_A\_T \quad (9)$$

with $$Coût\_ci = Coût\_unité\_surface \times Surface\_circuit\_dispo$$

where Nb_F(i) corresponds to the number of functions F(i) implemented in the subassembly, Coût_F(i) is the cost of the function F(i), Coût_C(j) is the cost of the connector C(j), Coût_ci is the cost of the circuit, Coût_unité_surface is the cost of the unit of area of the circuit, Surface_circuit_dispo is the available area of the circuit of the subassembly and Coût_A_T is the cost of assembling and testing the subassembly.

By using the characteristics obtained by means, for example, of the foregoing relationships, it is possible to determine the ratios and margins relative to the initial requirements such as defined by the user. For example, the ratio between the area used by the functions and the connectors and the area defined by the user can be expressed by the following relationship:

$$\text{Ratio\_surface} = \frac{\max(SurfR, SurfV)}{\text{Surface\_circuit\_dispo}} \quad (10)$$

The total space requirement of a subassembly as regards height can be determined according to the following relationship:

$$\text{Encombrement} = \text{Haut}R + \text{Haut}V + \text{Epaisseur\_circuit} \quad (11)$$

where Epaisseur_circuit is the thickness of the circuit of the subassembly.

The margin Marge_HautR relative to the height on the front side and the margin Marge_HautV relative to the height on the rear side can be calculated according to the following relationships:

$$\text{Marge\_Haut}R = \text{Haut}R\_\text{dispo} - \text{Haut}R \quad (12)$$

$$\text{Marge\_Haut}V = \text{Haut}V\_\text{dispo} - \text{Haut}V \quad (13)$$

where HautR_dispo and HautV_dispo are the available heights on the front and rear sides respectively of the subassembly.

The ratio 'Ratio_Puissance' of the power used relative to the available power 'Puissance_dispo' for each voltage can be calculated according to the following relationship:

$$\text{Ratio\_puissance} = \frac{\text{Puissance}}{\text{Puissance\_dispo}} \quad (14)$$

The 'Ratio_credit' of the estimated cost of the subassembly to the cost Coût_objectif defined by the user can be evaluated according to the following relationship:

$$\text{Ratio\_crédit} = \frac{\text{Coût\_SE}}{\text{Coût\_objectif}} \quad (15)$$

To determine the feasibility of the assembly, the user defines rules that must be satisfied. As an example, these rules may be:
  Ratio_surface<85%
  Marge_HautR>0
  Marge_HautV>0
  Ratio_puissance<100% (for each voltage)
  MTBF>desired MTBF
  Time<desired time
  Ratio_crédit<100%

If one of these criteria is not met, the subassembly is considered to be unfeasible.

FIG. 5 illustrates the summary 500 of electronic assembly 100. A first cell 505 gives the width of the box of the electronic assembly. This width is determined by the space requirement of each subassembly and the distance between the subassemblies. Summary 500 of electronic assembly 100 also indicates the characteristics of the available power supplies (reference 510), corresponding to the sum of the characteristics of the available power supplies of each subassembly, and the total available power (reference 515). Summary 500 of electronic assembly 100 also indicates the characteristics of the actually used power supplies (reference 520), corresponding to the sum of the characteristics of the power supplies actually used by each subassembly, and the total power consumed (reference 525). Summary 500 also indicates the reliability (reference 530) or the MTBF, determined according to the reliability of each subassembly (the $\lambda$ of the electronic assembly is equal to the sum of the $\lambda$ values of the subassemblies), the procurement time (reference 535) corresponding to the longest time for procurement of each subassembly, and the production cost (reference 540) corresponding to the sum of the production costs of each subassembly.

The information of summary 500 of the electronic assembly can be determined according to the following relationships:

$$l = \sum_i \text{Encombrement\_SE}(i) + (\text{Nb\_SE} + 1) \times \text{Jeu\_cartes} \quad (16)$$

where l is the width of the electronic assembly, Encombrement_SE(i) is the space requirement of subassembly i, Nb_SE is the number of subassemblies and Jeu_cartes is the distance between two subassemblies. By default, Jeu_cartes may be equal to 2 mm:

$$\text{P\_dispo}(i) = \sum_j \text{P\_dispo\_SE}(i, j) \quad (17)$$

and, $$\text{P\_dispo} = \sum_i \text{P\_dispo}(i)$$

where P_dispo(i) is the available power of the electronic assembly for voltage i, P_dispo_SE(i,j) is the power available for voltage i and subassembly j, and P_dispo is the power available for the electronic assembly:

$$\text{P\_eff}(i) = \sum_j \text{P\_eff\_SE}(i, j) \text{ et,} \quad (18)$$

$$\text{P\_eff} = \sum_i \text{P\_eff}(i)$$

where P_eff(i) is the actual power of the electronic assembly for voltage i, P_eff_SE(i,j) is the actual power for voltage i and subassembly j, and P_eff is the actual power for the electronic assembly;

$$MTBF = \frac{1}{\sum_i \frac{1}{\text{MTBF\_SE}(i)}} \quad (19)$$

where MTBF is the reliability of the electronic assembly and MTBF_SE(i) is the reliability of electronic subassembly i;

$$\text{Temps} = \max_i(\text{Temps\_SE}(i)) \quad (20)$$

where Temps is the time for procurement of the electronic assembly and Temps_SE(i) is the time for procurement of subassembly i; and:

$$\text{Coût} = \sum_i \text{Coût\_SE}(i) + \text{Coût\_Packaging} \qquad (21)$$

where Coût is the cost of the electronic assembly, Coût_SE (i) is the cost of subassembly i and Coût_Packaging is the cost of packaging the electronic assembly (which by default may be negligible).

In a particular exemplary embodiment, the invention is implemented in the calculation sheets by means of software of spreadsheet type such as Microsoft Excel or Lotus 1-2-3 (Excel is a trademark of Microsoft Corporation and Lotus 1-2-3 is a trademark of International Business Machines Corporation). In such an embodiment, the tables corresponding to FIGS. 3, 4 and 5 are constructed by using this spreadsheet. The relationships for estimating the characteristics of the subassemblies and of the electronic assembly as well as for determining the feasibility of the subassemblies and of the electronic assembly are programmed directly into this spreadsheet.

In this way the described method may be used in the preliminary development phase for
- distributing the functions over the various subassemblies,
- dimensioning the subassemblies,
- distributing the powers consumed over the different subassemblies relative to the allocated powers.

This solution exhibits numerous advantages, including
- use of the acquired experience for rapid analysis of the "physical" predictive feasibility of a new electronic need;
- integration of the feasibility study into the methodological process and the information system for electronic development;
- the possibility of adding complementary functionalities; and
- taking into account the evolution of the parameters of the functions by using program experience in order to refine the indicators of the analysis and to capitalize the experience.

Naturally, to satisfy specific needs, a person competent in the field of design of electronic assemblies will be able to apply modifications in the foregoing description.

The invention claimed is:

1. A method implemented by a computer, including a processor, that has been programmed with instructions that cause the computer to analyze feasibility of designing an electronic assembly composed of at least one subassembly, the method comprising:
    defining, by the processor, a functional architecture of the electronic assembly that includes a list of functions, the list of functions including at least one function;
    acquiring characteristics of the at least one function;
    determining the number of subassemblies according to at least one physical constraint or user defined constraint;
    distributing the functions of the list of functions among the subassemblies of the electronic assembly according to the number of subassemblies determined;
    determining characteristics of the subassemblies of the electronic assembly; and
    analyzing, by the processor, the electronic assembly, said analysis including analyzing the distribution of the functions within each one of the subassemblies using at least one criterion associated with a characteristic acquired or determined.

2. The method according to claim 1, wherein the characteristics of the functions of the list of functions are stored in memory in a database.

3. The method according to claim 1, further comprising: determining if the electronic assembly is feasible.

4. The method according to claim 1, further comprising: modifying the functional architecture, the number of subassemblies, the distribution of the functions of the list of functions over the subassemblies of the electronic assembly, or the characteristics of the subassemblies of the electronic assembly, the analyzing of the electronic assembly being repeated after the modification.

5. The method according to claim 1, further comprising: determining a number of connectors per subassembly and choosing characteristics of the connectors.

6. The method according to claim 5, further comprising: modifying the number of connectors per subassembly or the characteristics of the connectors, the analyzing of the electronic assembly being repeated after the modification.

7. The method according to claim 5, wherein the characteristics of the functions of the list of functions, of the connectors and of the at least one subassembly include physical characteristics, electrical characteristics or characteristics related to production times and costs.

8. The method according to claim 5, wherein the analyzing of the electronic assembly includes evaluating constraints related to the characteristics of the functions of the list of functions, of the connectors and of the at least one subassembly.

9. The method according to claim 8, wherein the analyzing of the electronic assembly additionally includes comparing the constraints with data entered by a user via a user interface.

10. The method according to claim 9, wherein the comparing of the constraints with the data entered by the user includes application of predetermined rules.

11. The method according to claim 1, wherein the at least one function is composed of at least one elementary function.

12. The method according to claim 9, wherein the user interface is of a spreadsheet type.

13. The method according to claim 12, wherein a first spreadsheet is associated with the functional architecture of the electronic assembly and a second spreadsheet is associated with the at least one subassembly.

14. A device that analyzes feasibility of designing an electronic assembly composed of at least one subassembly, comprising:
    a defining unit configured to define a functional architecture of the electronic assembly that includes a list of functions, the list of functions including at least one function;
    an acquiring unit configured to acquire characteristics of the at least one function;
    a determination unit configured to determine the number of subassemblies according to at least one physical constraint or user defined constraint;
    a distribution unit configured to distribute the functions of the list of functions among the subassemblies of the electronic assembly according to the number of subassemblies determined;
    a characteristic determining unit configured to determine characteristics of the subassemblies of the electronic assembly; and
    an analyzing unit configured to analyze the electronic assembly, said analysis including analyzing the distribution of the functions within each one of the subassemblies using at least one criterion associated with a characteristic acquired or determined.

15. A non-transitory readable storage medium encoded with instructions which when executed by a processor in a computer cause the computer to perform a method comprising:
   defining a functional architecture of the electronic assembly that includes a list of functions, the list of functions including at least one function;
   acquiring characteristics of the at least one function;
   determining the number of subassemblies according to at least one physical constraint or user defined constraint;
   distributing the functions of the list of functions among the subassemblies of the electronic assembly according to the number of subassemblies determined;
   determining characteristics of the subassemblies of the electronic assembly; and
   analyzing, by the processor, the electronic assembly, said analysis including analyzing the distribution of the functions within each one of the subassemblies using at least one criterion associated with a characteristic acquired or determined.

* * * * *